United States Patent
Yamada et al.

(10) Patent No.: US 8,338,862 B2
(45) Date of Patent: Dec. 25, 2012

(54) SEMICONDUCTOR DEVICE

(75) Inventors: Fumio Yamada, Yokohama (JP);
Kazutaka Inoue, Yokohama (JP)

(73) Assignee: Sumitomo Electric Industries, Ltd., Osaka (JP)

(*) Notice: Subject to any disclaimer, the term of this patent is extended or adjusted under 35 U.S.C. 154(b) by 78 days.

(21) Appl. No.: 12/953,887

(22) Filed: Nov. 24, 2010

(65) Prior Publication Data

US 2011/0127540 A1    Jun. 2, 2011

(30) Foreign Application Priority Data

Nov. 30, 2009  (JP) ................................. 2009-271415

(51) Int. Cl.
*H01L 31/072* (2012.01)
(52) U.S. Cl. ................................ 257/194; 257/E29.248
(58) Field of Classification Search .................. 257/192, 257/194, E29.248
See application file for complete search history.

(56) References Cited

U.S. PATENT DOCUMENTS

| 7,132,699 B2 * | 11/2006 | Kimura et al. ................. 257/192 |
| 2006/0220065 A1 | 10/2006 | Kawasaki et al. |
| 2010/0163928 A1 * | 7/2010 | Imada et al. ................... 257/194 |

FOREIGN PATENT DOCUMENTS

JP  2006-286740  10/2006

OTHER PUBLICATIONS

T. Kikkawa et al., "An Over 200-W Output Power GaN HEMT Push-Pull Amplifier with High Reliability", 2004 IEEE MTT-S Digest, 2004, pp. 1347-1350.

* cited by examiner

*Primary Examiner* — Quoc Hoang
(74) *Attorney, Agent, or Firm* — Smith, Gambrell and Russell, LLP

(57) ABSTRACT

A semiconductor device includes a substrate on which a GaN channel layer, an AlGaN electron supply layer and a GaN cap layer are stacked in this order, a gate electrode formed on the GaN cap layer, and a source electrode and a drain electrode formed on the AlGaN electron supply layer so as to interpose the gate electrode. A first recess is formed in the GaN cap layer and being located between the gate electrode and the source electrode. A thickness of the GaN cap layer in a bottom of the first recess is less than that of the GaN cap layer located under the gate electrode.

11 Claims, 7 Drawing Sheets

SEMICONDUCTOR DEVICE

CROSS-REFERENCE TO RELATED APPLICATION

This application is based upon and claims the benefit of priority of the prior Japanese Patent Application No. 2009-271415, filed on Nov. 30, 2009, the entire contents of which are incorporated herein by reference.

BACKGROUND (i) Technical Field

The present invention relates to semiconductor devices, and more particularly, GaN-based semiconductor devices.

(ii) Related Art

Semiconductor devices using a GaN-based semiconductor are used as power devices capable of operating at high frequencies and outputting high power. There is known an FET such as a high electron mobility transistor (HEMT) as a semiconductor device suitable particularly for amplifying operations in high-frequency bands, which may include microwaves, quasi-millimeter waves, or millimeter waves.

The HEMT using a GaN-based semiconductor (hereinafter referred to as GaN-based HEMT) is required to operate at high frequencies and output high power. This requirement may be achieved by increasing the mutual conductance and the breakdown voltage. For example, Japanese Patent Application Publication No. 2006-286740 (Document 1) discloses a GaN-based HEMT configured to have an AlGaN electron supply layer having a recess between a gate electrode and a drain electrode and another recess between the gate electrode and a source electrode.

The following document discloses a GaN-based HEMT having a GaN channel layer and an AlGaN electron supply layer configured to have a GaN cap layer on the AlGaN electron supply layer: T. Kikkawa, et al., "An Over 200-W Output Power GaN HEMT Push-Pull Amplifier with High Reliability", 2004 IEEE MTT-S Digest, 2004, p. 1347-1350 (Document 2).

SUMMARY OF THE INVENTION

According to an aspect of the present invention, there is provided a semiconductor device including: a substrate on which a GaN channel layer, an AlGaN electron supply layer and a GaN cap layer are stacked in this order; a gate electrode formed on the GaN cap layer; and a source electrode and a drain electrode formed on the AlGaN electron supply layer so as to interpose the gate electrode, a first recess being formed in the GaN cap layer and being located between the gate electrode and the source electrode, a thickness of the GaN cap layer in a bottom of the first recess being less than that of the GaN cap layer located under the gate electrode.

DETAILED DESCRIPTION

Figure 1:
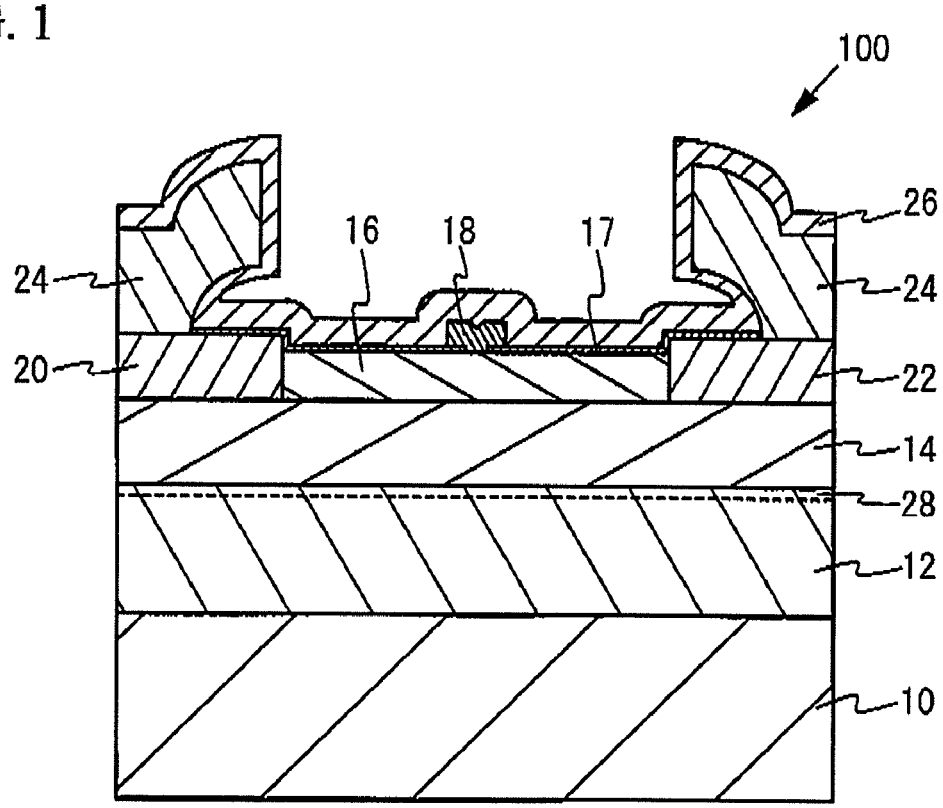
FIG. 1 is a schematic cross-sectional view of a semiconductor device in accordance with a comparative example.

First, a description will be given of a comparative example prior to description of embodiments of the invention. FIG. 1 is a schematic cross-sectional view of a semiconductor device in accordance with a comparative example. The comparative example is a GaN-based HEMT.

Referring to FIG. 1, a semiconductor device 100 of the comparative example has a substrate 10 made of, for example, SiC having a (0001) plane on which there are stacked a GaN channel layer 12, an AlGaN electron supply layer 14, a GaN cap layer 16 and an insulating film 17 in this order. A gate electrode 18 is formed so as to contact the upper surface of the GaN cap layer 16. A source electrode 20 and a drain electrode 22 are formed on the upper surface of the AlGaN electron supply layer 14 so as to interpose the gate electrode 18. The GaN cap layer 16 between the source electrode 20 and the drain electrode 22 does not have any recess and has a flat upper surface. A plating layer 24 is formed on the upper surface of the source electrode 20 and the upper surface of the drain electrode 22. A protection film 26 is provided so as to cover the plating layer 24, the source electrode 20, the GaN cap layer 16, the insulating film 17, the gate electrode 18 and the drain electrode 22.

A description will now be given of polarization that occurs in the GaN-based HEMT of the comparative example and the concentration of 2DEG (2 Dimensional Electron Gas). Polarization has spontaneous polarization due to the difference in electronegativity between atoms that form the GaN-based semiconductor crystals, and piezoelectric polarization due to stress in the semiconductor film resulting from the difference in lattice constant in tae semiconductor film.

Figure 2:
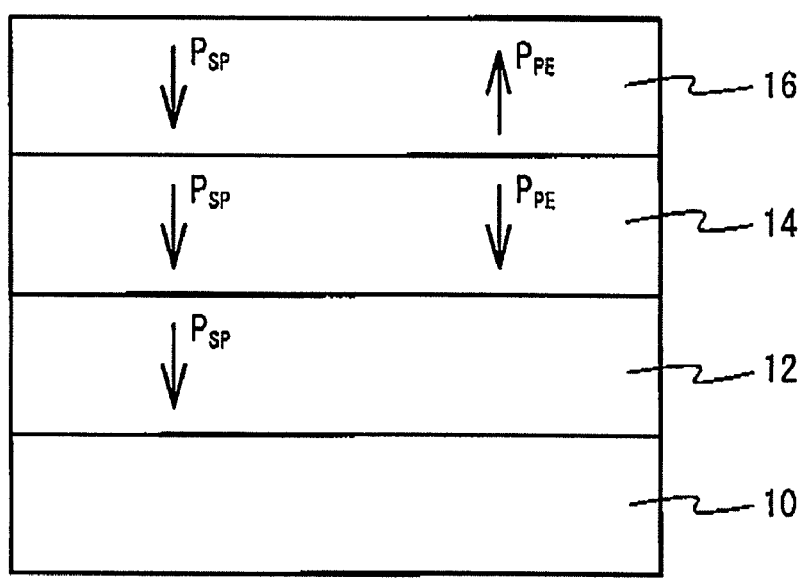
FIG. 2 is a diagram that describes polarization that occurs in the semiconductor device of the comparative example.

FIG. 2 is a diagram that describes polarization that occurs in the GaN-based HEMT of the comparative example. Referring to FIG. 2, spontaneous polarization $P_{sp}$ occurs in the GaN channel layer 12, the AlGaN electron supply layer 14 and the GaN cap layer 16 so that the side of each of these layers closer to the substrate 10 is positive. In the AlGaN electron supply layer 14, piezoelectric polarization $P_{PE}$ occurs in the same direction as that of the spontaneous polarization $P_{SP}$. The piezoelectric polarization $P_{PE}$ is due to stress resulting from the difference in lattice constant in the AlGaN electron supply layer 14. For example, GaN has an a-axis lattice constant of 3.18 angstroms and a c-axis lattice constant of 5.17 angstroms, while AlN has an a-axis lattice constant of 3.11 angstroms and a c-axis lattice constant of 4.98 angstroms. The piezoelectric polarization $P_{PE}$ occurs in the GaN cap layer 16 in the direction opposite to the direction in which the spontaneous polarization $P_{SP}$ occurs. The piezoelectric polarization $P_{PE}$ results from strain due to the difference in lattice constant between the GaN cap layer 16 and the AlGaN electron supply layer 14. By employing the GaN cap layer 16, it is possible to generate a piezoelectric effect in a direction in which the piezoelectric effect at the interface between the GaN channel layer 12 and the AlGaN electron supply layer 14 is prevented. The piezoelectric polarization $P_{PE}$ that occurs in the GaN cap layer 16 increases as the GaN cap layer 16 is thicker.

The concentration of 2DEG (see the reference numeral 28 in FIG. 1) generated at the interface between the GaN channel layer 12 and the AlGaN electron supply layer 14 increases or decreases due to the difference in polarization between the GaN channel layer 12 and the AlGaN electron supply layer 14. In the structure in which the GaN cap layer 16 is formed on the AlGaN electron supply layer 14, the piezoelectric effect in the direction in which the piezoelectric effect at the interface between the GaN channel layer 12 and the AlGaN electron supply layer 14 is prevented generated. It is thus possible to reduce the concentration of 2DEG generated at the interface between the GaN channel layer 12 and the AlGaN electron supply layer 14.

As descried above, the GaN-based HEMT of the comparative example, the GaN cap layer 16 is provided on the AlGaN electron supply layer 14. It is thus possible to improve the breakdown voltage due to relaxation of the electric field at the end portion of the gate electrode 18 and ensure high reliability by the protection of the surface of the AlGaN electron supply layer 14. It is further possible to improve the controllability of the threshold voltage and to improve the linearity of the mutual conductance (gm) since the GaN cap layer 16 makes it difficult to receive influence of the surface charge. However, the 2DEG concentration decreases, and the mutual conductance and the maximum forward current ($I_{fmax}$) decrease. Thus, the GaN-based HEMT of the comparative example has difficulty in realizing high-frequency operation and high-output operation. The following embodiments include GaN-based HEMT having a GaN channel layer, an AlGaN electron supply layer and a GaN cap layer stacked in this order and are capable of operating at high frequencies and outputting high power.

First Embodiment

Figure 3:
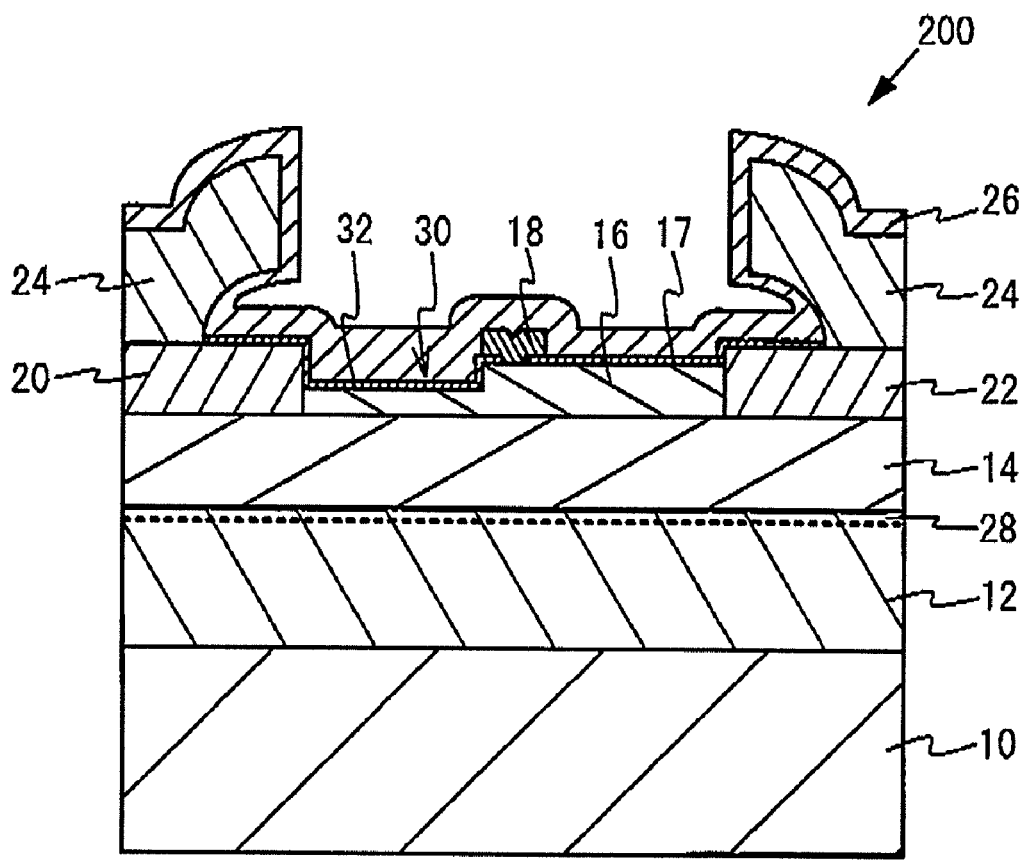
FIG. 3 is a schematic cross-sectional view of a semiconductor device in accordance with a first embodiment.

FIG. 3 is a schematic cross-sectional view of a semiconductor device in accordance with a first embodiment. A semiconductor device 200 of the first embodiment is a GaN-based HEMT. Referring to FIG. 3, the semiconductor device 200 of the first embodiment has the substrate made of, for example, SiC having the (0001) plane on which there are stacked the GaN channel layer 12, the AlGaN electron supply layer 14, the GaN cap layer 16 and the insulating film 17 of, for example, a SiN film in this order. No impurities are added to the GaN channel layer 12 and the AlGaN electron supply layer 14. Essentially, there is no need to add an impurity to the GaN cap layer 16. However, the GaN cap layer 16 may be an n-type layer having an impurity concentration of around $1\times10^{18}$ cm$^{-3}$ for the purpose of stabilizing and improving the reliability of the Fermi level of the semiconductor surface.

The gate electrode 18 is provided so as to contact the upper surface of the GaN cap layer 16. The gate electrode 18 may be a multilayer of Ni and Au stacked so that Ni is closer to the substrate 10. The source electrode 20 and the drain electrode 22 are formed on the upper surface of the AlGaN electron supply layer 14 so as to interpose the gate electrode 18. Each of the source electrode 20 and the drain electrode 22 may be a multilayer of Ti and Al stacked so that Ti is closer to the substrate 10. The GaN cap layer 16 is provided so as to extend on the AlGaN electron supply layer 14 between the source electrode 20 and the drain electrode 22. End surfaces of the GaN cap layer 16 contact the side surface of the source electrode 20 and that of the drain electrode 22.

A first recess 30 is formed in the GaN cap layer 16 between the gate electrode 18 and the source electrode 20. The first recess 30 has a bottom 32 under which the GaN cap layer 16 exists. That is, the thickness of the GaN cap layer 16 in the bottom 32 is less than that of the GaN cap layer 16 located under the gate electrode 18. The first recess 30 extends up to an end portion of the GaN cap layer 16 closer to the source electrode 20, and the bottom 32 connects to the side surface of the source electrode 20. The end portion of the first recess 30 closer to the source electrode 20 is formed so as to extend up to the side surface of the source electrode 20.

The plating layer 24 is formed on the upper surface of the source electrode 20 and that of the drain electrode 22. The plating layer 24 may be made of Au and 3 μm thick. The protection film 26 is formed so as to cover the plating layer 24, the source electrode 20, the GaN cap layer 16, the insulating film 17, the gate electrode 18 and the drain electrode 22. The protection film 26 may be made of SiN and 400 nm thick.

Figure 4A:
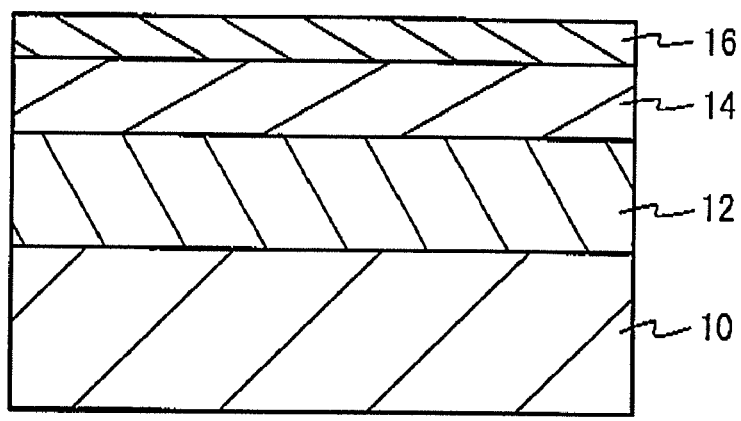
FIGS. 4A through 4C are schematic cross-sectional views that an exemplary method for fabricating the semiconductor device in accordance with the first embodiment.
Figure 4B:
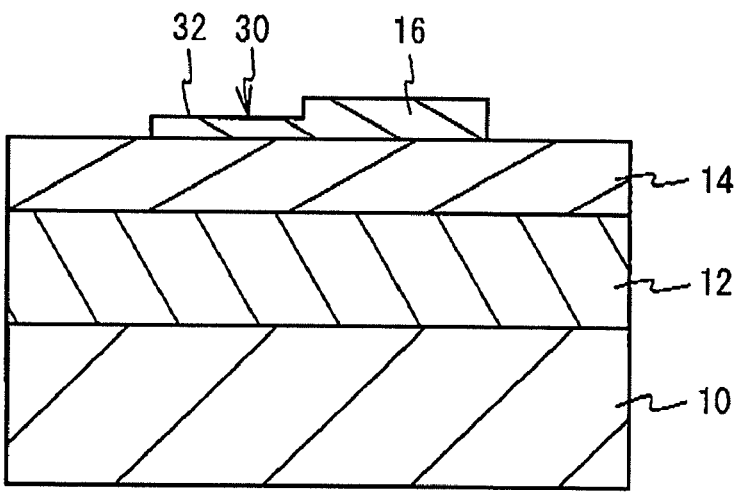
Figure 4C:
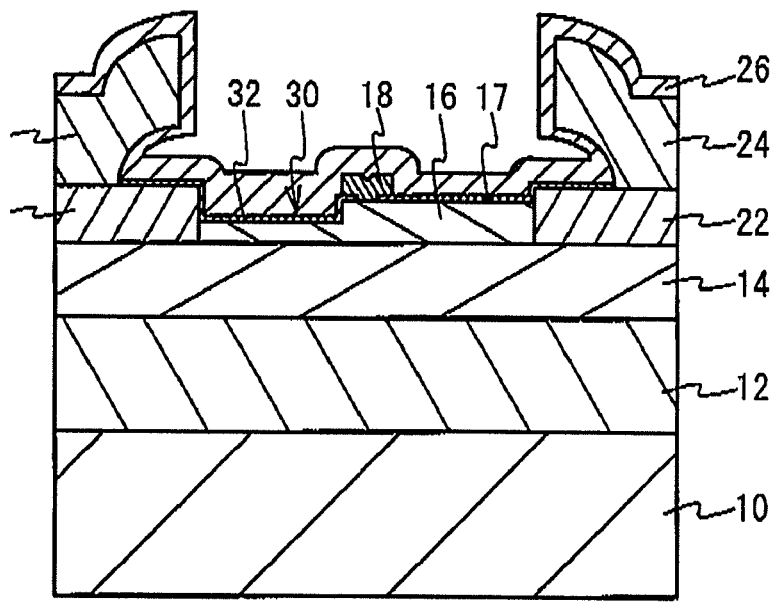

A description will now be given of a method for fabricating the GaN-based HEMT in accordance with the first embodiment. FIGS. 4A through 4C are cross-sectional views that illustrate an exemplary method for fabricating the GaN-based HEMT in accordance with the first embodiment.

Referring to FIG. 4A, on the upper surface of the substrate 10, there are epitaxially grown the GaN channel layer 12, the AlGaN electron supply layer 14, and the GaN cap layer 16 in this order by a MOCVD (Metal Organic Chemical Vapor Deposition) method.

Referring to FIG. 4B, a photoresist is formed on the GaN cap layer 16 by an exposure method so as to have openings located in areas in which the source electrode 20 and the drain electrode 22 should be formed. Next, the GaN cap layer 16 is removed by reactive ion etching (RIE) using chlorine gas with the photoresist being used as a mask. Thus, the surface of the AlGaN electron supply layer 14 is exposed in the areas in which the source electrode 20 and the drain electrode 22 should be formed. Then, a photoresist is formed on the AlGaN electron supply layer 14 and the GaN cap layer 16 by the exposure method so as to have an opening in an area in which the first recess 30 should be formed. Subsequently, the GaN cap layer 16 is removed by RIE using chlorine gas with the photoresist being used as a mask. The GaN cap layer 16 is etched so as to remain. This results in the first recess 30 in which the GaN cap layer 16 remains on the bottom 32.

Referring to FIG. 4C, the source electrode 20 and the drain electrode 22 are formed on the exposed surface portions of the AlGaN electron supply layer 14 defined by the process of FIG. 4B by an evaporation method or a liftoff method. The source electrode 20 and the drain electrode 22 may be a Ti/Al multilayer in which Ti is closer to the substrate 10. Next, the insulating film 17, which may be a SiN film, is deposited on the upper surface of the GaN cap layer 16, the upper source of the source electrode 20 and the upper surface of the drain electrode 22 by a plasma-assisted CVD, for example. Then, the insulating film 17 in an area in which the gate electrode 18 should be formed is removed by etching. Thereafter, the gate electrode 18 is formed on the upper surface of the GaN cap layer 16 in the area from which the insulating film 17 has been removed by the evaporation or liftoff method. The GaN cap layer 16 may be a Ni/Au multilayer in which Ni is closer to the substrate 10. Then, the insulating film 17 on the source electrode 20 and the drain electrode 22 is removed by etching, and the plating layer 24 is formed on the upper surface of the source electrode 20 and that of the drain electrode 22 by a plating method. After that, SiN is entirely deposited by the plasma-assisted CVD, for example. This results in the protection film 26 that covers the plating layer 24, the source electrode 20, the GaN cap layer 16, the insulating film 17, the gate electrode 18 and the drain electrode 22. Through the above-mentioned fabrication process, the GaN-based HEMT illustrated in FIG. 3 is complete.

A description is given of results of simulation intended to compare the maximum forward current Ifmax of the semiconductor device 200 of the first embodiment with the maximum forward current Ifmax of the semiconductor device 100 of the comparative example.

Figure 5:
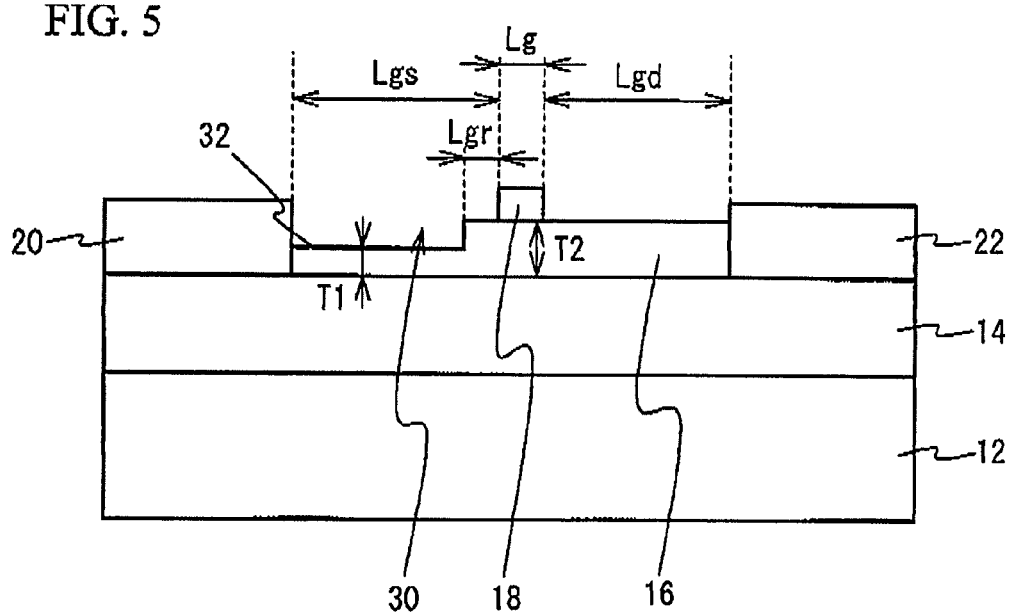
FIG. 5 is a schematic cross-sectional view of a semiconductor device of the first embodiment used in simulation in which dimensions of structural parts are illustrated.

The dimensions of the semiconductor device 200 of the first embodiment used in the simulation are described with reference to FIG. 5. Referring to FIG. 5, the GaN channel layer 12 of the semiconductor device 200 has a thickness of 0.3 μm. The AlGaN electron supply layer 14 is configured to have a composition ratio of $Al_{0.25}Ga_{0.75}N$ and have a thickness of 22 nm. The gate electrode 18 is 0.5 μm thick, and the source electrode 20 and the drain electrode 22 are 1.0 μm thick. A thickness T1 of the GaN cap layer 16 in the bottom 32 of the first recess 30 is equal to 5 nm, and a thickness T2 of the GaN cap layer 16 located under the gate electrode 18 is equal to 15 nm. A gate length Lg of the gate electrode 18 is 0.25 μm. A distance Lgs between the end portion of the gate electrode 18 closer to the source electrode 20 and the end portion of the source electrode 20 closer to the gate electrode 18 is equal to 1.0 μm. A distance Lgd between the end portion of the gate electrode 18 closer to the drain electrode 22 and the end portion of the drain electrode 22 closer to the gate electrode 18 is equal to 3.0 μm. In the simulation, a distance Lgr between the end portion of the gate electrode 18 closer to the source electrode 20 and the end portion of the first recess 30 closer to the gate electrode 18 is changed to 0.5 μm, 0.2 μm and 0 μm.

The dimensions and materials of the semiconductor device 100 of the comparative example used in the simulation are the same as those of the semiconductor device 200 of the first embodiment illustrated in FIGS. 3 and 5 except that the thickness of the GaN cap layer 16 is set equal to 5 nm and 15 nm.

Figure 6:
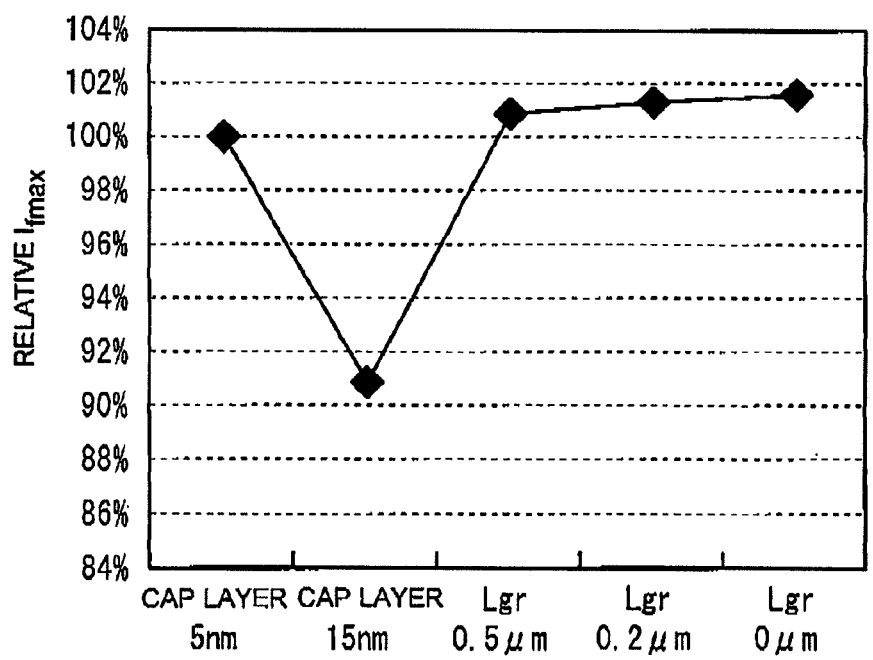
FIG. 6 is a graph of a maximum forward current $I_{fmax}$ of the semiconductor device of the comparative example and that of the semiconductor device of the first embodiment.

FIG. 6 is a graph of the results of simulation of the maximum forward current $I_{fmax}$. As to the horizontal axis, "CAP LAYER 5 nm" and "CAP LAYER 15 nm" respectively denote cases where the GaN cap layer 16 of the semiconductor device 100 of the comparative example is set equal to 5 nm and 15 nm, respectively. Further, "Lgr 0.5 μm", "Lgr 0.2 μm" and "Lgr 0 μm" denote cases where the distance Lgr between the gate electrode 18 and the first recess 30 of the semiconductor device 200 of the first embodiment is set equal to 0.5 μm, 0.2 μm and 0 μm, respectively. The vertical axis indicates the relative values of the maximum forward current $I_{fmax}$ defined by setting the value of the maximum forward current $I_{fmax}$ in the semiconductor device 100 of the comparative example with the thickness of the GaN cap layer 16 being set equal to 5 nm as the standard value (100%). In the simulation, the maximum forward current $I_{fmax}$ is the drain-source current that flows when a voltage of 2 V is applied between the gate and the source and a voltage of 10 V is applied to the drain and the source.

As illustrated in FIG. 6, in the semiconductor device of the comparative example, the maximum forward current $I_{fmax}$ decreases when the thickness of the GaN cap layer 16 is increased from 5 nm to 15 nm. This is because the piezoelectric polarization that occurs in the GaN cap layer 16 is increased due to the increased thickness of the GaN cap layer 16 and the concentration of 2DEG is thus decreased.

In contrast, the semiconductor device 200 of the first embodiment is configured to have the first recess 30 in the GaN cap layer 16 between the gate electrode 18 and the source electrode 20. Thus, the GaN cap layer 16 is 5 nm thick between the gate electrode 18 and the source electrode 20, although the GaN cap layer 16 located under the gaze electrode 18 is as thick as 15 nm. The semiconductor device 200 of the first embodiment has the maximum forward current $I_{fmax}$ as much as that of the semiconductor device 100 of the comparative example with the thickness of the GaN cap layer 16 being equal to 5 nm. Further, almost the same maximum forward currents $I_{fmax}$ are obtained for the different distances Lgr between the gate electrode 18 and the first recess 30.

As described above, according to the first embodiment, the first recess 30 is formed in the GaN cap layer 16 between the gate electrode 18 formed on the GaN cap layer 16 and the source electrode formed on the AlGaN electron supply layer 14, and the thickness of the GaN cap layer 16 in the bottom 32 of the first recess 30 is less than that of the GaN cap layer 16 located under the gate electrode 18. With the above structure, it is possible to reduce the piezoelectric polarization that occurs in the GaN cap layer 16 and to improve the concentration of 2DEG at the interface between the GaN channel layer 12 between the gate electrode 18 and the source electrode 20 and the AlGaN electron supply layer 14. That is, it is possible to improve the 2DEG concentration at the interface corresponding to the thinned portion of the GaN cap layer 16 due to the presence of the first recess 30. Thus, it is possible to suppress decrease in the mutual conductance gm and the maximum forward current $I_{fmax}$ and realize the GaN-based HEMT capable of operating at high frequencies and outputting high power.

The thickness T2 of the GaN cap layer 16 located under the gate electrode 18 is preferably equal to or greater than 10 nm in order to protect the surface of the AlGaN electron supply layer 14 and relax the concentration of the electric field at the end portion of the gate electrode 18 to improve the breakdown voltage. It is preferable that the thickness T2 of the GaN cap layer 16 located under the gate electrode 18 is approximately 200 nm in order to keep the gate electrode 18 away from the depletion layer in order to improve the resistance to the influence of the surface charge and ensure high reliability. That is, the thickness T2 of the GaN cap layer 16 located under the gate electrode 18 is preferably equal to or greater than 30 nm and is equal to or less than 100 nm, and is more preferably equal to or greater than 60 nm and is equal to or less than 100 nm.

The thickness T1 of the GaN cap layer 16 in the bottom 32 of the first recess 30 is preferably equal to or less than 5 nm in order to improve the 2DEG concentration. For the purpose of protecting the surface of the AlGaN electron supply layer 14, the thickness T1 of the GaN cap layer in the bottom 32 of the first recess 30 is preferably equal to or greater than 1.5 nm. That is, the thickness T1 of the GaN cap layer 16 in the bottom 32 of the first recess 30 is preferably equal to or greater than 1.5 nm and is equal to or less than 5 nm, and is more preferably equal to or greater than 2 nm and is equal to or less than 4.5 nm, and is much more preferably equal to or greater than 2.5 nm and is equal to or less than 4 nm.

Figure 7A:
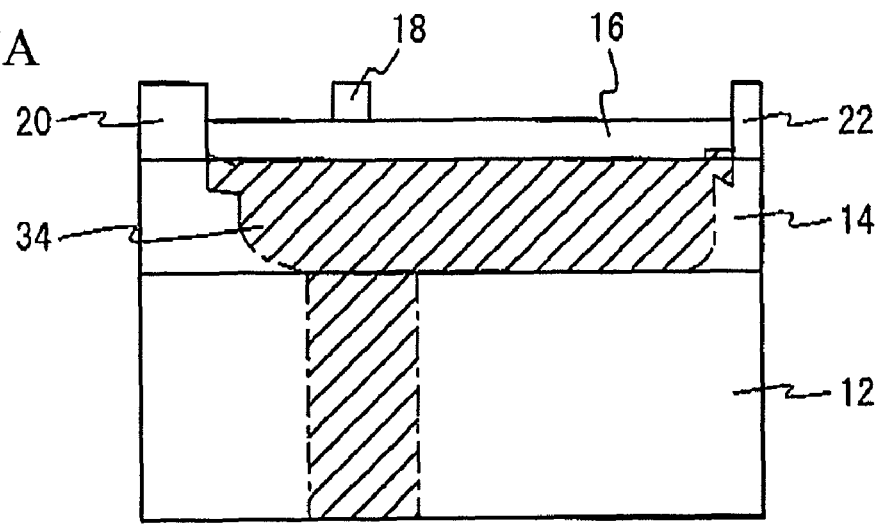
FIGS. 7A through 7C are schematic cross-sectional views that illustrate results of simulation about changes in the shape of a depletion layer s caused as the distance between a gate electrode and a first recess is changed.
Figure 7B:
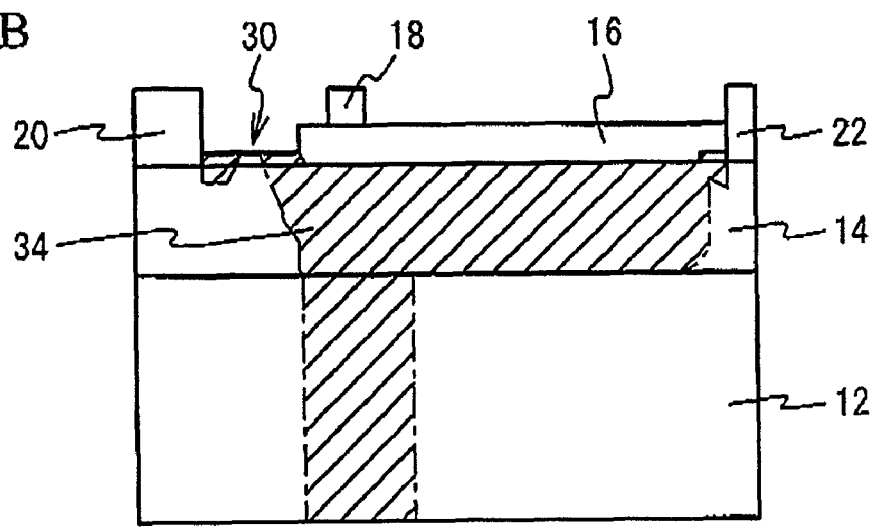
Figure 7C:
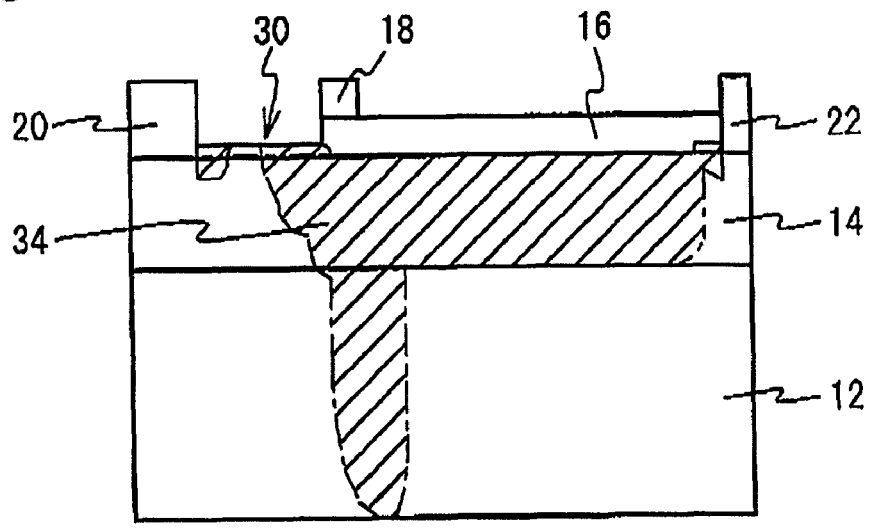

A description will now be given, with reference to FIGS. 7A through 7C, of results of simulation as to change of the shape of the depletion layer observed when the distance Lgr between the gate electrode 18 and the first recess 30 in the semiconductor device 200 of the first embodiment is changed. The dimensions of the structural parts of the semiconductor device 200 used in the simulation are the same as illustrated in FIG. 5. FIG. 7B illustrates the result of simulation in which the distance Lgr between the gate electrode 18 and the first recess 30 is equal to 0.2 µm, and FIG. 7C illustrates the result of simulation in which the distance Lgr is equal to 0 µm. FIG. 7A illustrates a result of simulation of the semiconductor device 100 of the comparative example in which the thickness of the GaN cap layer 16 is 5 nm and the dimensions and materials of the other structural parts are the same as those of the semiconductor device 200 of the first embodiment that has been described with reference to FIGS. 3 and 5. In the simulation, the gate voltage is −6 V, and the source-drain voltage is 60 V. In FIGS. 7A through 7C, the depletion layers 34 formed in the semiconductor devices are illustrated as hatched areas.

The depletion layers 34 having similar shapes are formed in the semiconductor device 100 of the comparative example in which the first recess 30 is not provided (FIG. 7A) and in the semiconductor device 200 of the first embodiment in which the distance Lgr between the gate electrode 18 and the first recess 30 is set equal to 0.2 µm (FIG. 7B). In contrast, in the semiconductor device 200 of the first embodiment with the distance Lgr being set equal to 0 µm, the depletion layer 34 does not extend greatly, and the depletion layer 34 in the GaN channel layer 12 is narrowed. Although the gate length and gate capacitance for the distance Lgr of 0 µm are the same as those for the case where the first recess 30 is not provided or those for the distance Lgr of 0.2 µm, the effective gate length becomes shorter and the short channel effect occurs.

Figure 8:
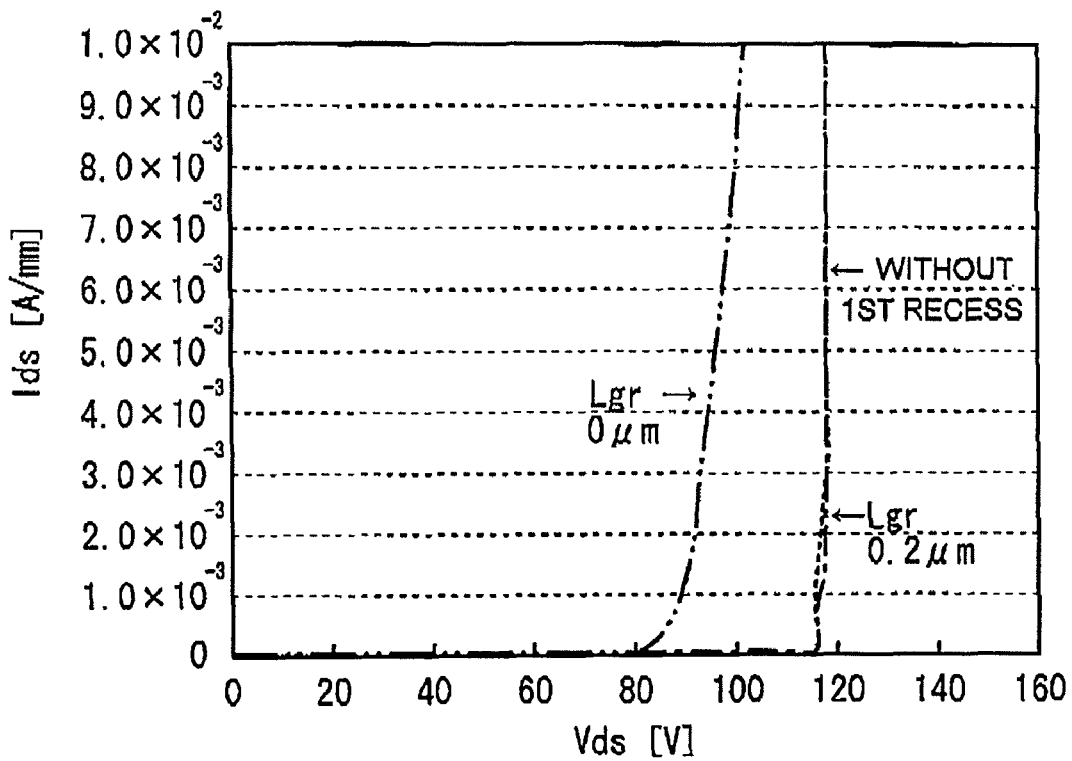
FIG. 8 is a graph of results of simulation about a current-voltage characteristic observed when the distance between the gate electrode and the first recess is changed.

A description will now be given, with reference to FIG. 8, of results of simulation about the current-voltage characteristic in the OFF state in a case where the distance Lgr between the gate electrode 18 and the first recess 30 is changed. The horizontal axis is the source-drain voltage, and the vertical axis is the source-drain current. The dimensions of the structural parts of the semiconductor device 200 of the first embodiment used in the simulation are the same as those that have been described with reference to FIG. 5. As a comparison with the first embodiment, FIG. 8 illustrates a result of simulation of the semiconductor device 100 of the comparative example in which the thickness of the GaN cap layer 16 is 5 nm and the dimensions and materials of the other structural parts are the same as those of the semiconductor device 200 of the first embodiment that has been described with reference to FIGS. 3 and 5. A one-dotted chain line in FIG. 8 is a result of simulation in which the distance Lgr between the gate electrode 18 and the first recess 30 is set equal to 0.2 µm, and a two-dotted chain line is a result of simulation in which the distance Lgr is set equal to 0 µm. A broken line is a result of simulation in the semiconductor device 100 of the comparative example that does not have the first recess 30.

As illustrated in FIG. 8, similar breakdown characteristics are obtained for the semiconductor device 100 of the comparative example without the first recess 30 and for the semiconductor device 200 of the first embodiment in which the distance between the gate electrode 18 and the first recess 30 is set equal to 0.2 µm. In contrast, the breakdown voltage decreases and the leakage current characteristic is degraded for the semiconductor device 200 of the first embodiment with the distance Lgr being set equal to 0 µm.

As has been described with reference to FIGS. 7A through 7C and FIG. 8, it is preferable that the distance Lgr between the end portion of the gate electrode closer to the source electrode 20 and the end portion of the first recess 30 closer to the gate electrode 18 is equal to or greater than 0.2 µm for the purpose of suppressing degradation of the shape of the depletion layer 34 and decrease in the breakdown voltage. Particularly, when a process margin such as alignment in forming the first recess 30 is taken into consideration, it is more preferable that the distance Lgr is equal to or greater than 0.4 µm. Preferably, the distance Lgr is equal to or less than an amount of space capable of suppressing decrease in the 2DEG concentration.

As illustrated in FIG. 3, the end portion of the first recess 30 closer to the source electrode 20 is preferably formed so as to extend up to the side surface of the source electrode 20. With this structure, it is possible to improve the 2DEG concentration thoroughly between the gate electrode 18 and the source electrode 20.

The substrate 10 used in the first embodiment is not limited to SiC but may be a Si substrate, a GaN substrate or a sapphire substrate. The GaN channel layer 12, the AlGaN electron supply layer 14 and the GaN cap layer 16 may be formed on the (0001) plane of the substrate 10 made of any of SiC, GaN and sapphire or on the (111) plane of the substrate 10 made of Si. With the above structure, it is possible to increase spontaneous polarization or piezoelectric polarization. As described above, it is preferable the main surface of the substrate 10 has the (0001) plane for the substrate 10 made of any of SiC, GaN and sapphire, and has the (111) plane for the substrate 10 made of Si.

Second Embodiment

Figure 9:
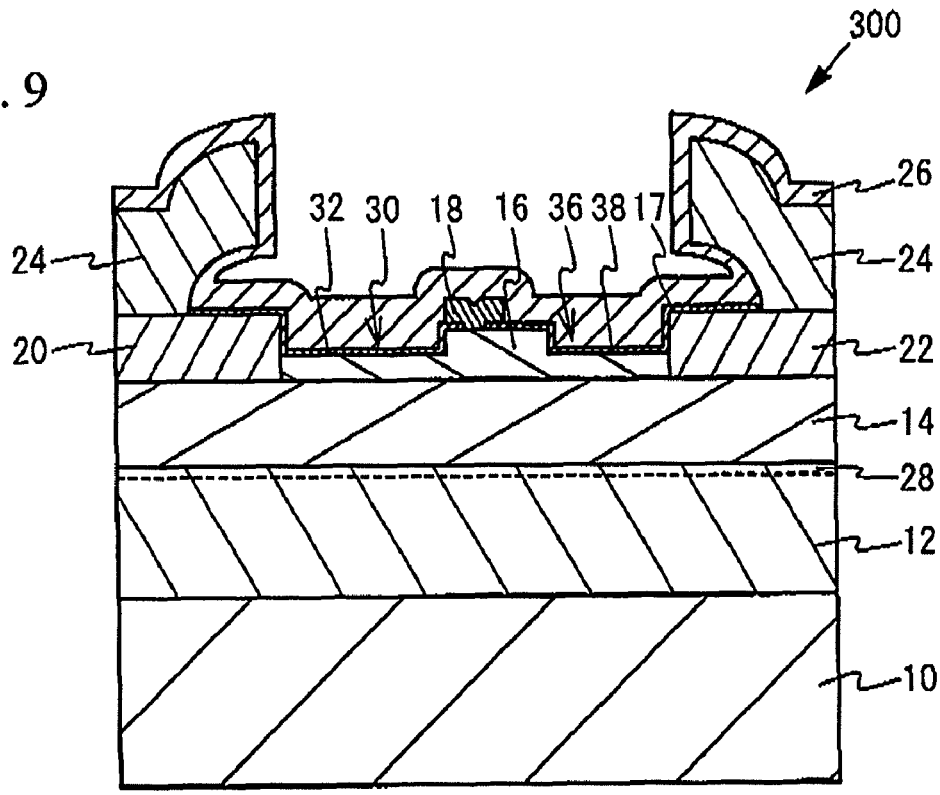
FIG. 9 is a schematic cross-sectional view of a semiconductor device in accordance with a second embodiment.

A second embodiment is an exemplary semiconductor device in which a second recess is formed in the GaN cap layer between the gate electrode and the drain electrode. FIG. 9 is a cross-sectional view of a semiconductor device in accordance with the second embodiment.

Referring to FIG. 9, a semiconductor device 300 of the second embodiment has a second recess 36 in the GaN cap layer 16 located between the gate electrode 18 and the drain electrode 22. The second recess 36 has a bottom 38, under which the GaN cap layer 16 exits. That is, the thickness of the GaN cap layer 16 in the bottom 38 is less than that of the GaN cap layer 16 located under the gate electrode 18. The second recess 36 extends up to the end portion of the GaN cap layer 16 closer to the drain electrode 22, and the bottom 38 connects the side surface of the drain electrode 22. That is, the end portion of the second recess closer to the drain electrode 22 is formed so as to extend up to the side surface of the drain electrode 22. The other structures of the second embodiment are the same as those of the first embodiment and are illustrated in FIG. 3.

As described above, according to the second embodiment, second recess 36 is formed in the GaN cap layer 16 between the gate electrode 18 on the GaN cap layer 16 and the drain electrode 22 on the AlGaN electron supply layer 14, and the thickness of the GaN cap layer 16 in the bottom 38 of the second recess 36 is less than that of the GaN cap layer 16 located under the gate electrode 18. With the above structure, it is possible to improve the concentration of 2DEG generated at the interface between the GaN channel layer 12 and the AlGaN electron supply layer 14 between the gate electrode 18 and the drain electrode 22 and to relax the concentration of the electric field at the end potion of the drain electrode 22 and improve the drain breakdown voltage.

The thickness of the GaN cap layer 16 in the bottom of the second recess 36 is preferably equal to or greater than 1.5 nm and is equal to or less than 5 nm for the same purpose as that of the first embodiment, and is more preferably equal to or greater than 2 nm and is equal or less than 4.5 nm. Much more preferably, the above thickness of the GaN cap layer 16 is equal to or greater than 2.5 nm and is equal to or less than 4 nm. In order to improve the 2DEG concentration thoroughly between the gate electrode 18 and the drain electrode 22, it is preferable that the end portion of the second recess 36 closer to the drain electrode 22 is formed so as to extend up to the side surface of the drain electrode 22.

In the second embodiment, the depth of the first recess 30 and the depth of the second recess 36 may be equal to or different from each other. In other words, the thickness of the GaN cap layer 16 in the bottom 32 of the first recess 30 may be equal to or different from that of the GaN cap layer 16 in the bottom 38 of the second recess 36. In the case where the first recess 30 and the second recess 36 have the same depth, these recesses may be concurrently formed by a common process. It is thus possible to suppress the number of processes. In the case where the first recess 30 and the second recess 36 have different depths, it is possible to independently control the resistance between the gate electrode 18 and the source electrode and the resistance between the gate electrode 18 and the drain electrode 22.

Figure 10:
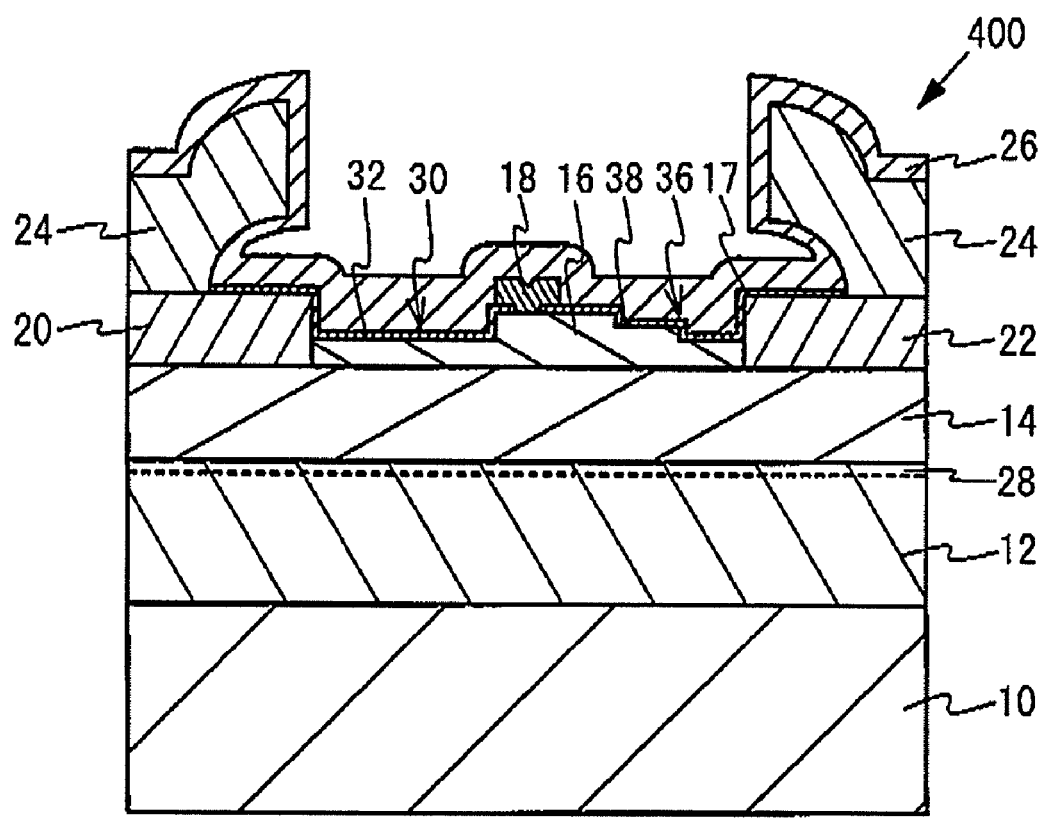
FIG. 10 is a schematic cross-sectional view of a semiconductor device in accordance with a variation of the second embodiment.

FIG. 10 is a schematic cross-sectional view of a semiconductor device in accordance with a variation of the second embodiment. Referring to FIG. 2, a semiconductor device 400 in accordance with the variation of the second embodiment is configured to have multiple bottoms 38 in the second recess 36 so that the second recess 36 may have mutually different depths with respect to the multiple bottoms. In other words, the GaN cap layer 16 has different thickness values with respect to the multiple bottoms 38. The second recess 36 has a multi-step structure in which the GaN cap layer 16 in the bottom 38 is stepwisely thinned towards the drain electrode 22.

As described above, according to the variation of the second embodiment, the second recess 36 has the multi-step structure in which the GaN cap layer 16 in the bottom 38 is stepwisely thinned towards the drain electrode 22. It is thus possible to further facilitate relaxation of the electric field and improve the drain breakdown voltage.

The present invention is not limited to the specifically described embodiments and variations, but other embodiments and variations may be made without departing from the scope of the claimed invention.

What is claimed is:

1. A semiconductor device comprising:
   a substrate on which a GaN channel layer, an AlGaN electron supply layer and a GaN cap layer are stacked in this order;
   a gate electrode formed on the GaN cap layer; and
   a source electrode and a drain electrode formed on the AlGaN electron supply layer so as to interpose the gate electrode, wherein
   a first recess is formed in the GaN cap layer and located between the gate electrode and the source electrode,
   a second recess is formed in the GaN cap layer and located between the gate electrode and the drain electrode,
   a thickness of the GaN cap layer in a bottom of the first recess is smaller than a thickness of the GaN cap layer located under the gate electrode;
   a thickness of the GaN cap layer in a bottom of the second recess is smaller than the thickness of the GaN cap layer located under the gate electrode, and
   an end portion of the second recess closer to the drain electrode is formed so as to extend up to a side surface of the drain electrode.

2. The semiconductor device according to claim 1, wherein the thickness of the GaN cap layer located under the gate electrode is equal to or greater than 10 nm.

3. The semiconductor device according to claim 1, wherein the thickness of the GaN cap layer in the bottom of the first recess is equal to or less than 5 nm.

4. The semiconductor device according to claim 1, wherein a distance between an end portion of the gate electrode closer to the source electrode and an end portion of the first recess closer to the gate electrode is equal to or greater than 0.2 µm.

5. The semiconductor device according to claim 1, wherein a end portion of the first recess portion is extended to a side surface of the source electrode.

6. The semiconductor device according to claim 1, wherein the substrate is made of SiC, GaN or sapphire and a main surface of the substrate is a (0001) plane.

7. The semiconductor device according to claim 1, wherein the substrate is made of Si and a main surface of the substrate is a (111) plane.

8. A semiconductor device comprising:
   a substrate on which a GaN channel layer, an AlGaN electron supply layer and a GaN cap layer are stacked in this order;
   a gate electrode formed on the GaN cap layer; and
   a source electrode and a drain electrode formed on the AlGaN electron supply layer so as to interpose the gate electrode, wherein
   a first recess is formed in the GaN cap layer and located between the gate electrode and the source electrode,
   a second recess is formed in the GaN cap layer and located between the gate electrode and the drain electrode,
   a thickness of the GaN cap layer in a bottom of the first recess is smaller than a thickness of the GaN cap layer located under the gate electrode,
   a thickness of the GaN cap layer in a bottom of the second recess is smaller than the thickness of the GaN cap layer located under the gate electrode, and
   the second recess has multi-step structure in which a thickness of the GaN cap layer in the bottom of the second recess is thinned stepwise towards the drain electrode.

9. The semiconductor device according to claim 8, wherein a end portion of the first recess portion is extended to a side surface of the source electrode.

10. The semiconductor device according to claim 8, wherein the substrate is made of SiC, GaN or sapphire and a main surface of the substrate is a (0001) plane.

11. The semiconductor device according to claim 8, wherein the substrate is made of Si and a main surface of the substrate is a (111) plane.

* * * * *